(12) United States Patent
Shim et al.

(10) Patent No.: US 8,222,517 B2
(45) Date of Patent: Jul. 17, 2012

(54) THIN FILM SOLAR CELL

(75) Inventors: Hyunja Shim, Seoul (KR); Seungyoon Lee, Seoul (KR); Dongjoo You, Seoul (KR); Heonmin Lee, Seoul (KR); Suntae Hwang, Seoul (KR); Sehwon Ahn, Seoul (KR); Youngjoo Eo, Seoul (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 12/702,893

(22) Filed: Feb. 9, 2010

(65) Prior Publication Data

US 2011/0041901 A1 Feb. 24, 2011

(30) Foreign Application Priority Data

Aug. 19, 2009 (KR) .................. 10-2009-0076824

(51) Int. Cl.
*H01L 31/00* (2006.01)
(52) U.S. Cl. ........................................... 136/255
(58) Field of Classification Search .................. 136/255
See application file for complete search history.

(56) References Cited

U.S. PATENT DOCUMENTS

| | | | | |
|---|---|---|---|---|
| 4,591,892 A * | 5/1986 | Yamazaki | ............. | 257/458 |
| 4,843,451 A * | 6/1989 | Watanabe et al. | ............. | 136/258 |
| 5,230,753 A * | 7/1993 | Wagner | ............. | 148/403 |
| 6,399,873 B1 * | 6/2002 | Sano et al. | ............. | 136/249 |
| 2004/0221887 A1 * | 11/2004 | Kondo et al. | ............. | 136/255 |
| 2005/0205127 A1 * | 9/2005 | Watanabe et al. | ............. | 136/255 |
| 2009/0255581 A1 * | 10/2009 | Myong | ............. | 136/258 |

FOREIGN PATENT DOCUMENTS

| | | |
|---|---|---|
| JP | 5-102505 A | 4/1993 |
| JP | 2007-157915 A | 6/2007 |
| JP | 2007-180364 A | 7/2007 |
| JP | 2007-227631 A | 9/2007 |
| JP | 2009-141059 A | 6/2009 |

OTHER PUBLICATIONS

Morimoto et al. "Doping effect of oxygen or nitrogen impurity in hydrogenated amorphous silicon films." Appl. PHys. Lett. 59 (17) Oct. 21, 1991.*

Krause et al. "Structural and optoelectronic properties of microcrystalline silicon germanium" Journal of Non-Crystalline Solids 299-302 (2002) 158-162.*

Nelson "Properties of light" http://www.tulane.edu/~sanelson/geol211/proplight.htm This reference was retrieved via http://replay.waybackmachine.org/20020306174538/http://www.tulane.edu/~sanelson/geol211/proplight.htm, which dates the information back to Mar. 6, 2002.*

* cited by examiner

*Primary Examiner* — Jennifer Michener
*Assistant Examiner* — Magali P Slawksi
(74) *Attorney, Agent, or Firm* — Birch, Stewart, Kolasch & Birch, LLP

(57) ABSTRACT

A solar cell is disclosed. The solar cell includes a substrate, a first electrode on the substrate, a second electrode, and a photoelectric transformation unit between the first electrode and the second electrode. The photoelectric transformation unit includes a first intrinsic (referred to as an i-type) semiconductor layer formed of amorphous silicon doped with at least one of carbon (C) and oxygen (O) as impurities and a second i-type semiconductor layer formed of germanium (Ge)-doped microcrystalline silicon.

4 Claims, 12 Drawing Sheets

|  | Type 1 | | Type 2 | |
| --- | --- | --- | --- | --- |
|  | a-Si:H | mc-Si:H | a-Si:H(C,O) | mc-Si:H(Ge) |
| Bandgap | 1.75 | 1.1 | 1.9 | 0.8 |
| Voc | 1 | | 1.05 | |
| Jsc | 1 | | 1.1 | |
| FF | 1 | | 1.0 | |
| Eff | 1 | | 1.15 | |

| | Type 1 (Double) | Type 2 (Triple) | Type 3 (Triple) | Type 4 (Triple) | Type 5 (Triple) | Type 6 (Triple) |
|---|---|---|---|---|---|---|
| | a-Si:H | a-Si:H | a-Si:H(C,O) | a-Si:H | a-Si:H(C,O) | a-Si:H(C,O) |
| | | a-Si:H | a-Si:H | a-Si:H(Ge) | a-Si:H(Ge) | a-Si:H(Ge) |
| | mc-Si:H | mc-Si:H | mc-Si:H | mc-Si:H | mc-Si:H | mc-Si:H(Ge) |
| Bandgap | 1.75 | 1.75 | 1.9 | 1.75 | 1.9 | 1.9 |
| | | 1.75 | 1.75 | 1.5 | 1.5 | 1.5 |
| | 1.1 | 1.1 | 1.1 | 1.1 | 1.1 | 0.8 |
| Voc | 1 | 1.23 | 1.50 | 1.50 | 1.57 | 1.55 |
| Jsc | 1 | 0.50 | 0.60 | 0.67 | 0.75 | 0.80 |
| FF | 1 | 1.05 | 1.00 | 1.05 | 1.00 | 1.00 |
| Eff | 1 | 0.65 | 0.90 | 1.06 | 1.18 | 1.24 |

THIN FILM SOLAR CELL

This application claims the benefit of Korean Patent Application No. 10-2009-0076824 filed on Aug. 19, 2009, the entire contents of which is incorporated herein by reference for all purposes as if fully set forth herein.

BACKGROUND OF THE INVENTION

1. Field of the Invention

Embodiments of the invention relate to a solar cell.

2. Discussion of the Related Art

A solar cell is an element capable of converting light energy into electrical energy and includes a p-type semiconductor and an n-type semiconductor.

A general operation of the solar cell is as follows. If light coming from the outside is incident on the solar cell, electron-hole pairs are formed inside a semiconductor of the solar cell. The electrons move toward the n-type semiconductor and the holes move toward the p-type semiconductor by an electric field generated inside the semiconductor of the solar cell. Hence, electric power is produced.

The solar cell may be mainly classified into a silicon-based solar cell, a compound-based solar cell, and an organic-based solar cell depending on a material used. The silicon-based solar cell may be classified into a crystalline silicon (c-Si) solar cell and an amorphous silicon (a-Si) solar cell depending on a phase of a semiconductor.

SUMMARY OF THE INVENTION

In one aspect, there is a solar cell including a substrate, a first electrode on the substrate, a second electrode, and a photoelectric transformation unit between the first electrode and the second electrode, wherein the photoelectric transformation unit includes a first intrinsic (an i-type) semiconductor layer formed of amorphous silicon doped with at least one of carbon (C) and oxygen (O) as impurities and a second i-type semiconductor layer formed of germanium (Ge)-doped microcrystalline silicon.

The first i-type semiconductor layer and the second i-type semiconductor layer may be positioned on a light incident surface of the substrate in the order named.

An impurity content of the at least one of carbon (C) and oxygen (O) of the first i-type semiconductor layer may be about 10 atom % to 50 atom %. A Ge content of the second i-type semiconductor layer may be about 3 atom % to 20 atom %.

In another aspect, there is a solar cell including a substrate, a first electrode on the substrate, a second electrode, and a photoelectric transformation unit between the first electrode and the second electrode, wherein the photoelectric transformation unit includes a first photoelectric transformation unit including a first intrinsic (an i-type) semiconductor layer formed of amorphous silicon doped with at least one of carbon (C) and oxygen (O) as impurities, a second photoelectric transformation unit including a second i-type semiconductor layer formed of germanium (Ge)-doped amorphous silicon, and a third photoelectric transformation unit including a third i-type semiconductor layer formed of Ge-doped microcrystalline silicon.

The first photoelectric transformation unit, the second photoelectric transformation unit, and the third photoelectric transformation unit may be positioned on a light incident surface of the substrate in the order named.

A Ge content of the third i-type semiconductor layer may be less than a Ge content of the second i-type semiconductor layer.

A thickness of the third i-type semiconductor layer may be greater than a thickness of the second i-type semiconductor layer, and the thickness of the second i-type semiconductor layer may be greater than a thickness of the first i-type semiconductor layer.

An interlayer may be positioned between the second photoelectric transformation unit and the third photoelectric transformation unit. An interlayer may be positioned between the first photoelectric transformation unit and the second photoelectric transformation unit.

The solar cell may further include a first interlayer between the first photoelectric transformation unit and the second photoelectric transformation unit and a second interlayer between the second photoelectric transformation unit and the third photoelectric transformation unit. A thickness of the second interlayer may be greater than a thickness of the first interlayer. A refractive index of the first interlayer may be greater than a refractive index of the second interlayer at a first wavelength band. The refractive index of the first interlayer may be less than the refractive index of the second interlayer at a second wavelength band longer than the first wavelength band.

A Ge content of the third i-type semiconductor layer may be about 3 atom % to 20 atom %. A Ge content of the second i-type semiconductor layer may be about 5 atom % to 30 atom %. An impurity content of the at least one of carbon (C) and oxygen (O) of the first i-type semiconductor layer may be about 10 atom % to 50 atom %.

In another aspect, there is a solar cell including a substrate, a first electrode on the substrate, a second electrode, a first intrinsic (an i-type) semiconductor layer between the first electrode and the second electrode, the first i-type semiconductor layer being formed of amorphous silicon, and a second i-type semiconductor layer between the first electrode and the second electrode, the second i-type semiconductor layer being formed of microcrystalline silicon, wherein the first i-type semiconductor layer and the second i-type semiconductor layer are doped with the same impurities.

The first i-type semiconductor layer and the second i-type semiconductor layer may be doped with germanium (Ge). A Ge content of the first i-type semiconductor layer may be more than a Ge content of the second i-type semiconductor layer.

The Ge content of the second i-type semiconductor layer may be about 3 atom % to 20 atom %. The Ge content of the first i-type semiconductor layer may be about 5 atom % to 30 atom %.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings.

FIGS. 1 to 6 are related to a solar cell according to an embodiment of the invention. A structure of the solar cell shown in FIG. 1 may be referred to as a pin structure.

Figures 1, 2:
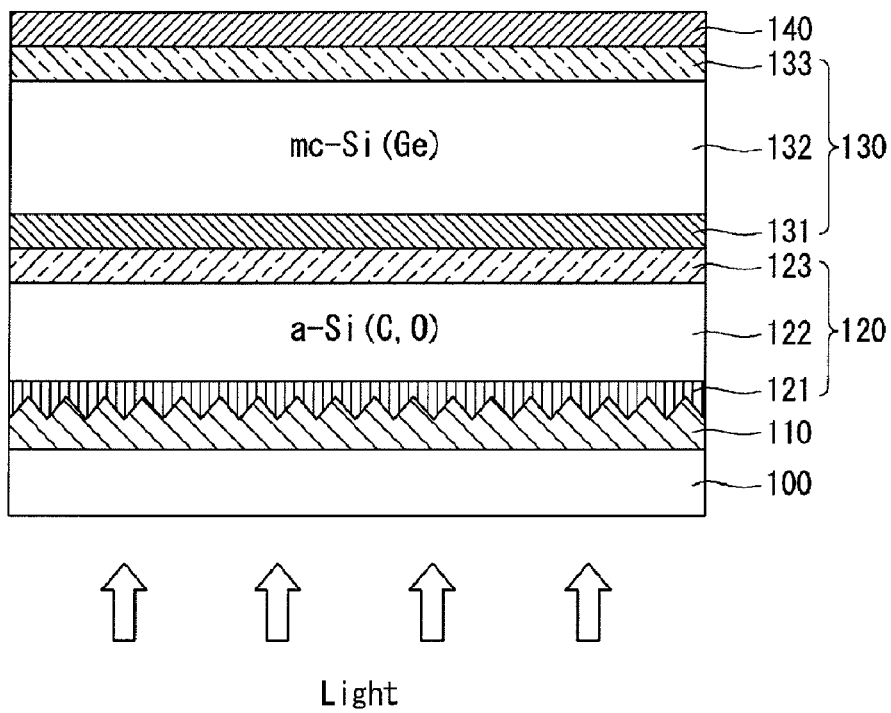
FIGS. 1 to 6 are related to a solar cell according to an embodiment of the invention.

As shown in FIG. 1, a solar cell 10 according to an embodiment of the invention includes a substrate 100, a first electrode 110 (hereinafter referred to as "a front electrode") on the substrate 100, a second electrode 140 (hereinafter referred to as "a rear electrode"), and photoelectric transformation units 120 and 130.

The photoelectric transformation units 120 and 130 are positioned between the front electrode 110 and the rear electrode 140 to produce electric power using light coming from the outside. The photoelectric transformation unit 120 may include a first intrinsic (referred to as an i-type) semiconductor layer 122 formed of amorphous silicon doped with at least one of carbon (C) and oxygen (O) as impurities, and the photoelectric transformation unit 130 may include a second i-type semiconductor layer 132 formed of germanium (Ge)-doped microcrystalline silicon.

The substrate 100 may provide a space for other functional layers. Further, the substrate 100 may be formed of a transparent material, such as glass, plastic or other material, so that light coming from the outside is efficiently incident on the photoelectric transformation units 120 and 130.

The front electrode 110 may be formed of a transparent material with electrical conductivity so as to increase a transmittance of incident light. For example, the front electrode 110 may be formed of a material, having high transmittance and high electrical conductivity, and may be selected from the group consisting of indium tin oxide (ITO), tin-based oxide (e.g., $SnO_2$), AgO, $ZnO-Ga_2O_3$ (or $Al_2O_3$), fluorine tin oxide (FTO), and a combination thereof, so that the front electrode 110 transmits most of the incident light and a current flows in the front electrode 110. A specific resistance of the front electrode 110 may be approximately $10^{-11}$ Ω·cm to $10^{-2}$ Ω·cm.

The front electrode 110 may be formed on the entire surface of the substrate 100 and may be electrically connected to the photoelectric transformation units 120 and 130. Hence, the front electrode 110 may collect carriers (e.g., holes) produced by the incident light to output the carriers.

An uneven pattern having, for example, an uneven pyramid structure may be formed on an upper surface of the front electrode 110. In other words, the front electrode 110 may have a textured surface. Accordingly, when the surface of the front electrode 110 is textured, a reflectance of light may be reduced, and an absorptance of light may increase. Hence, the efficiency of the solar cell 10 may be improved.

Although FIG. 1 shows the textured surface of the front electrode 110, other portions of the solar cell 10 may have textured surfaces. For example, each of the photoelectric transformation units 120 and 130 may have a textured surface. In the embodiment of the invention, the textured surface of the front electrode 110 is described below for the convenience of explanation.

In the embodiment shown, the rear electrode 140 may be formed of metal with high electrical conductivity so as to increase a recovery efficiency of electric power produced by the photoelectric transformation units 120 and 130. Further, the rear electrode 140 electrically connected to the photoelectric transformation units 120 and 130 may collect carriers (e.g., electrons) produced by the incident light to output the carriers.

The photoelectric transformation units 120 and 130 may convert light from the outside into electrical energy. Further, the first and second i-type semiconductor layers 122 and 132 of the respective photoelectric transformation units 120 and 130 may improve the efficiency of the solar cell 10 by adjusting their band gaps.

Preferably, though not required, components of the photoelectric transformation units 120 and 130 may be distinguished as including the first photoelectric transformation unit 120 and the second photoelectric transformation unit 130.

The first photoelectric transformation unit 120 may be an amorphous silicon cell using amorphous silicon (a-Si), for example, hydrogenated amorphous silicon (a-Si:H). The first photoelectric transformation unit 120 may absorb light of a short wavelength band to produce electric power.

The first photoelectric transformation unit 120 may include a first p-type semiconductor layer 121, the first i-type semiconductor layer 122, and a first n-type semiconductor layer 123 that are formed on the front electrode 110 in the order named.

The first p-type semiconductor layer 121 may be formed using a gas obtained by adding impurities of a group III element, such as boron (B), gallium (Ga) and indium (In), and at least one of carbon and oxygen to a raw gas containing silicon (Si).

The first i-type semiconductor layer 122 may reduce recombination of the carriers and may absorb light. The first i-type semiconductor layer 122 may absorb light of the short wavelength band to produce carriers, such as electrons and holes. The first i-type semiconductor layer 122 may be formed of amorphous silicon (a-Si), for example, hydrogenated amorphous silicon (a-Si:H). The first i-type semiconductor layer 122 may approximately have a thickness of 200 nm to 300 nm, so as to sufficiently absorb light of the short wavelength band.

Because the first i-type semiconductor layer 122 may be doped with at least one of carbon and oxygen as impurities, a band gap of the first i-type semiconductor layer 122 may increase by the doped carbon and oxygen. Hence, an absorptance of the first i-type semiconductor layer 122 with respect to light of the short wavelength band may increase, and the efficiency of the solar cell 10 may be improved.

The first n-type semiconductor layer 123 may be formed using a gas obtained by adding impurities of a group V element, such as phosphor (P), arsenic (As) and antimony (Sb), to a raw gas containing Si.

The first photoelectric transformation unit 120 may be formed using a chemical vapor deposition (CVD) method, such as a plasma enhanced chemical vapor deposition (PECVD) method.

In the first photoelectric transformation unit 120, the first p-type semiconductor layer 121 and the first n-type semiconductor layer 123 may form a p-n junction with the first i-type semiconductor layer 122 interposed between the first p-type semiconductor layer 121 and the first n-type semiconductor layer 123. In other words, the first i-type semiconductor layer 122 is positioned between the first p-type semiconductor layer 121 (i.e., a p-type doped layer) and the first n-type semiconductor layer 123 (i.e., an n-type doped layer).

In such a structure of the solar cell 10, when light is incident on the first p-type semiconductor layer 121, a depletion region is formed inside the first i-type semiconductor layer 122 because of the first p-type semiconductor layer 121 and the first n-type semiconductor layer 123 each having a relatively high doping concentration to thereby generate an electric field. Electrons and holes generated in the first i-type semiconductor layer 122 are separated by a contact potential difference through a photovoltaic effect and move in different directions. For example, the holes move to the front electrode 110 through the first p-type semiconductor layer 121, and the electrons move to the rear electrode 140 through the first n-type semiconductor layer 123. Hence, electric power is produced.

In the first photoelectric transformation unit 120, at least one of the first p-type semiconductor layer 121 and the first n-type semiconductor layer 123 may be doped with at least one of carbon (C) and oxygen (O) under condition that the first i-type semiconductor layer 122 is doped with at least one of carbon (C) and oxygen (O). Preferably, the first p-type semiconductor layer 121 may be doped with at least one of carbon (C) and oxygen (O).

Further, in the first photoelectric transformation unit 120, all of the first p-type semiconductor layer 121, the first i-type semiconductor layer 122, and the first n-type semiconductor layer 123 may contain amorphous silicon. Alternatively, the first n-type semiconductor layer 123 may contain microcrystalline silicon (mc-Si).

The second photoelectric transformation unit 130 may be a silicon cell using microcrystalline silicon (mc-Si), for example, hydrogenated microcrystalline silicon (mc-Si:H). The second photoelectric transformation unit 130 may absorb light of a long wavelength band to produce electric power.

The second photoelectric transformation unit 130 may include a second p-type semiconductor layer 131, the second i-type semiconductor layer 132, and a second n-type semiconductor layer 133. Locations of the second p-type semiconductor layer 131 and the second n-type semiconductor layer 133 may be reversed in embodiments of the invention.

The second photoelectric transformation unit 130 may be formed using a CVD method, such as a PECVD method, in the same manner as the first photoelectric transformation unit 120.

The second i-type semiconductor layer 132 may reduce recombination of the carriers and may absorb light in the same manner as the first i-type semiconductor layer 122. The second i-type semiconductor layer 132 may mainly absorb light of the long wavelength band to produce carriers, such as electrons and holes. The second i-type semiconductor layer 132 may be formed of microcrystalline silicon (mc-Si), for example, hydrogenated microcrystalline silicon (mc-Si:H). A thickness of the second i-type semiconductor layer 132 may be greater than a thickness of the first i-type semiconductor layer 122, so as to sufficiently absorb light of the long wavelength band. For example, the thickness of the second i-type semiconductor layer 132 may be approximately 1,500 nm to 3,000 nm.

The second i-type semiconductor layer 132 may be doped with germanium (Ge) as impurities. Germanium may reduce a band gap of the second i-type semiconductor layer 132. Accordingly, an absorptance of the second i-type semiconductor layer 132 with respect to the light of the long wavelength band may increase, and thus the efficiency of the solar cell 10 may be improved.

For example, the PECVD method may be used to dope the second i-type semiconductor layer 132 with Ge. In the PECVD method, a very high frequency (VHF), a high frequency (HF), or a radio frequency (RF) signal may be applied to a chamber filled with Ge gas.

In the second photoelectric transformation unit 130, the second p-type semiconductor layer 131 and the second n-type semiconductor layer 133 may form a p-n junction with the second i-type semiconductor layer 132 interposed between the second p-type semiconductor layer 131 and the second n-type semiconductor layer 133. Hence, holes generated by incident light move to the front electrode 110 through the second p-type semiconductor layer 131, and electrons generated by the incident light move to the rear electrode 140 through the second n-type semiconductor layer 133. As a result, electric power is produced.

In the second photoelectric transformation unit 130, at least one of the second p-type semiconductor layer 131 and the second n-type semiconductor layer 133 may be doped with Ge under condition that the second i-type semiconductor layer 132 is doped with Ge.

Further, in the second photoelectric transformation unit 130, all of the second p-type semiconductor layer 131, the second i-type semiconductor layer 132, and the second n-type semiconductor layer 133 may contain microcrystalline silicon (mc-Si).

FIG. 2 illustrates characteristics of a type 1 solar cell where first and second i-type semiconductor layers are not doped with carbon (C), oxygen (O), and Ge, and a type 2 solar cell where a first i-type semiconductor layer is doped with at least one of carbon (C) and oxygen (O) as impurities and a second i-type semiconductor layer is doped with Ge.

As shown in FIG. 2, in the type 1 solar cell, the first i-type semiconductor layer is formed of hydrogenated amorphous silicon (a-Si:H), and the second i-type semiconductor layer is formed of hydrogenated microcrystalline silicon (mc-Si:H). In the type 2 solar cell, as in the embodiment of the invention, the first i-type semiconductor layer is formed of hydrogenated amorphous silicon (a-Si:H(C,O)) doped with at least one of carbon (C) and oxygen (O), and the second i-type semiconductor layer is formed of Ge-doped hydrogenated microcrystalline silicon (mc-Si:H(Ge)).

In the type 1 solar cell, a band gap of the first i-type semiconductor layer is 1.75 eV, and a band gap of the second i-type semiconductor layer is 1.1 eV.

Further, in the type 1 solar cell, an open circuit voltage Voc is approximately 1 V, a circuit short current Jsc is approximately 1 mA/cm$^2$, a fill factor FF is approximately 1, and an efficiency Eff is approximately 1. Characteristics Voc, Jsc, FF, and Eff of the type 1 solar cell are set, so that the type 1 solar cell and the type 2 solar cell are compared with each other.

On the other hand, in the type 2 solar cell, a band gap of the first i-type semiconductor layer is 1.9 eV and is greater than that in the type 1 solar cell by approximately 0.15 eV. A band gap of the second i-type semiconductor layer is 0.8 eV and is less than that in the type 1 solar cell by about 0.3 eV.

Further, in the type 2 solar cell, an open circuit voltage Voc is approximately 1.05 V, a circuit short current Jsc is approximately 1.1 mA/cm$^2$, a fill factor FF is approximately 1.0, and an efficiency Eff is approximately 1.15.

As above, in the type 2 solar cell, because the first i-type semiconductor layer is formed of hydrogenated amorphous silicon (a-Si:H(C,O)) doped with at least one of carbon (C) and oxygen (O) and the second i-type semiconductor layer is formed of Ge-doped hydrogenated microcrystalline silicon (mc-Si:H(Ge)), the band gap of the second i-type semiconductor layer while increasing the band gap of the first i-type semiconductor layer may be reduced. Hence, the efficiency of the solar cell 10 may be improved.

Figure 3:
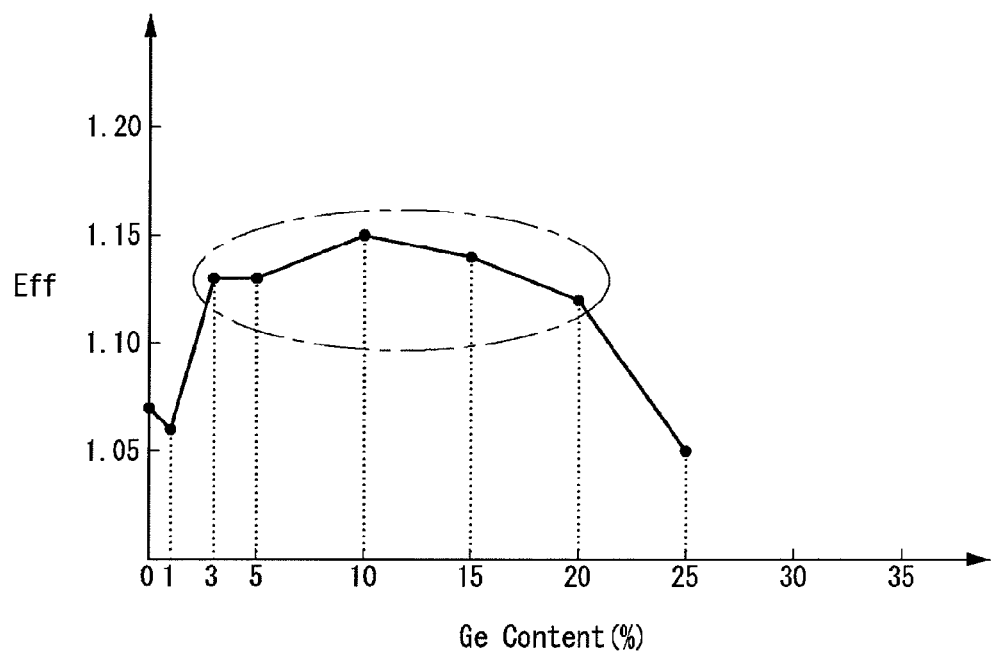

FIG. 3 is a graph illustrating the efficiency of a solar cell depending on a Ge content of a second i-type semiconductor layer.

As shown in FIG. 3, when the Ge content of the second i-type semiconductor layer is 0 to 1 atom %, the efficiency of the solar cell is approximately 1.06 to 1.07. In this case, the band gap of the second i-type semiconductor layer may not be sufficiently reduced because of a small amount of Ge.

On the other hand, when the Ge content of the second i-type semiconductor layer is 3 to 20 atom %, the efficiency of the solar cell has a sufficiently improved value of approximately 1.12 to 1.15. In this case, the band gap of the second i-type semiconductor layer may be sufficiently reduced because of the sufficient Ge content. Hence, an absorptance of the second i-type semiconductor layer with respect to light of the long wavelength band may increase.

On the other hand, when the Ge content of the second i-type semiconductor layer is 25 atom %, the efficiency of the solar cell has a reduced value of approximately 1.05. In this case, a portion of Ge may operate as a defect inside the second i-type semiconductor layer because of an excessively large amount of Ge. As a result, the efficiency of the solar cell may be reduced in spite of an increase in the Ge content.

Considering the description of FIG. 3, it may be preferable that the Ge content of the second i-type semiconductor layer is about 3 to 20 atom %.

Strontium (Sr) may replace Ge contained in the second i-type semiconductor layer. In other words, even if the second i-type semiconductor layer is doped with Sr, the band gap of the second i-type semiconductor layer may be sufficiently reduced.

Figure 4:
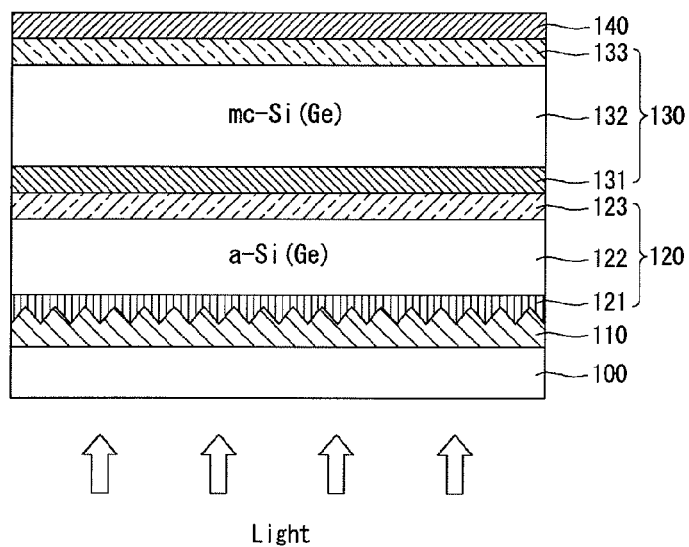

As shown in FIG. 4, the first i-type semiconductor layer 122 may be doped with Ge as impurities. In this case, the band gap of the first i-type semiconductor layer 122 may be reduced because of Ge. Hence, an absorptance of the first i-type semiconductor layer 122 with respect to light of the long wavelength band may increase, and the efficiency of the solar cell 10 may be improved as compared with a related art solar cell.

As shown in FIG. 4, the solar cell according to the embodiment of the invention includes an i-type semiconductor layer formed of amorphous silicon (i.e., the first i-type semiconductor layer 122) between the front electrode 110 and the rear electrode 140 and an i-type semiconductor layer formed of microcrystalline silicon (i.e., the second i-type semiconductor layer 132) between the front electrode 110 and the rear electrode 140. The i-type semiconductor layer formed of amorphous silicon and the i-type semiconductor layer formed of microcrystalline silicon may be doped with the same material, i.e., Ge.

In this case, in the first photoelectric transformation unit 120, at least one of the first p-type semiconductor layer 121 and the first n-type semiconductor layer 123 may be doped with Ge under condition that the first i-type semiconductor layer 122 is doped with Ge. Preferably, though not required, both the first p-type semiconductor layer 121 and the first n-type semiconductor layer 123 may be doped with Ge.

Figure 5:
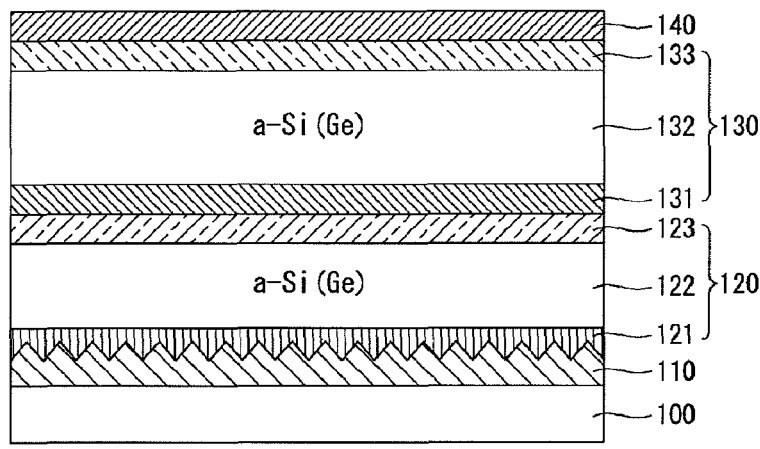
Figure 5:

Further, as shown in FIG. 5, both the first photoelectric transformation unit 120 and the second photoelectric transformation unit 130 may be an amorphous silicon cell using amorphous silicon (a-Si), for example, hydrogenated amorphous silicon (a-Si:H). In this case, both the first i-type semiconductor layer 122 and the second i-type semiconductor layer 132 may contain amorphous silicon and may be doped with Ge.

Figure 6:
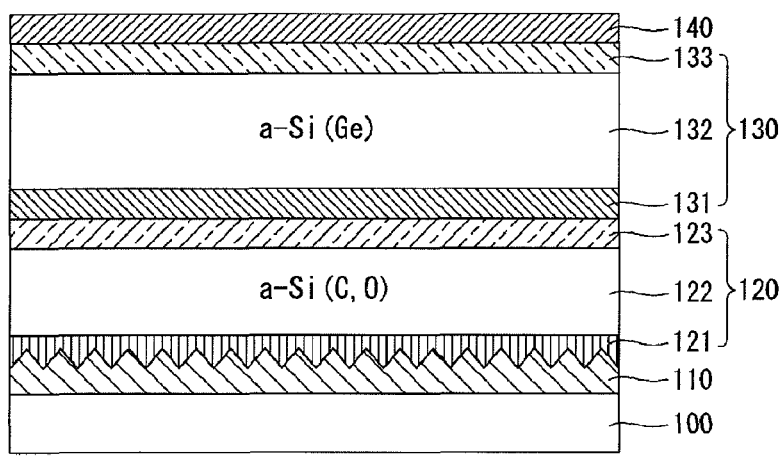
Figure 6:

Further, as shown in FIG. 6, both the first photoelectric transformation unit 120 and the second photoelectric transformation unit 130 may be an amorphous silicon cell using amorphous silicon (a-Si), for example, hydrogenated amorphous silicon (a-Si:H). In this case, the first i-type semiconductor layer 122 formed of amorphous silicon may be doped with at least one of carbon (C) and oxygen (O), and the second i-type semiconductor layer 132 formed of amorphous silicon may be doped with Ge The structure of the solar cell 10 shown in FIGS. 5 and 6 may be substantially the same as the solar cell 10 shown in FIGS. 1 to 4, except that both the first i-type semiconductor layer 122 and the second i-type semiconductor layer 132 of the solar cell 10 shown in FIGS. 5 and 6 contain amorphous silicon.

FIGS. 7 to 11 are related to another structure of a solar cell according to an embodiment of the invention. A structure of the solar cell 10 shown in FIG. 7 may be referred to as a pin-pin-pin structure. A further description of structures and components identical or equivalent to those illustrated in FIGS. 1 to 6 may be briefly made or may be entirely omitted.

Figures 7, 8:
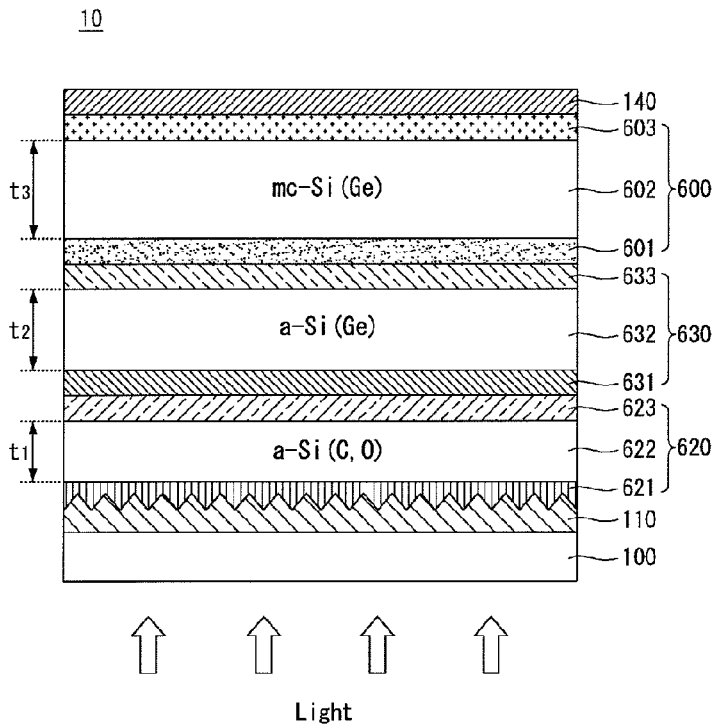
FIGS. 7 to 12 are related to another structure of a solar cell according to an embodiment of the invention.

As shown in FIG. 7, the solar cell 10 according to the embodiment of the invention includes first, second, and third photoelectric transformation units 620, 630, and 600. The first photoelectric transformation unit 620 includes a first i-type semiconductor layer 622 formed of amorphous silicon (a-Si(C, O)) doped with at least one of carbon (C) and oxygen (O) as impurities. The second photoelectric transformation unit 630 includes a second i-type semiconductor layer 632 formed of Ge-doped amorphous silicon (a-Si(Ge)). The third photoelectric transformation unit 600 includes a third i-type semiconductor layer 602 formed of Ge-doped microcrystalline silicon (mc-Si(Ge)).

The first, second, and third photoelectric transformation units 620, 630, and 600 may be positioned on a light incident surface of a substrate 100 in the order named. More specifically, a first p-type semiconductor layer 621, a first i-type semiconductor layer 622, a first n-type semiconductor layer 623, a second p-type semiconductor layer 631, a second i-type semiconductor layer 632, a second n-type semiconductor layer 633, a third p-type semiconductor layer 601, a third i-type semiconductor layer 602, and a third n-type semiconductor layer 603 be positioned on the substrate 100 in the order named.

The first photoelectric transformation unit 620 may be an amorphous silicon cell using amorphous silicon (a-Si(C, O)) doped with at least one of carbon (C) and oxygen (O) as impurities, for example, hydrogenated amorphous silicon (a-Si:H(C, O)). The first photoelectric transformation unit 620 may absorb light of a short wavelength band to produce power.

The second photoelectric transformation unit 630 may be an amorphous silicon cell using Ge-doped amorphous silicon (a-Si(Ge)), for example, hydrogenated Ge-doped amorphous silicon (a-Si:H(Ge)). The second photoelectric transformation unit 630 may absorb light of the short wavelength band to produce electric power.

The third photoelectric transformation unit 600 may be an amorphous silicon cell using Ge-doped microcrystalline silicon (mc-Si(Ge)), for example, hydrogenated Ge-doped microcrystalline silicon (mc-Si:H(Ge)). The third photoelectric transformation unit 600 may absorb light of a long wavelength band to produce electric power.

A thickness t3 of the third i-type semiconductor layer 602 may be greater than a thickness t2 of the second i-type semiconductor layer 632, and the thickness t2 of the second i-type semiconductor layer 632 may be greater than a thickness t1 of the first i-type semiconductor layer 622.

FIG. 8 is a table illustrating characteristics of a solar cell depending on a structure of a photoelectric transformation unit.

In FIG. 8, a type 1 solar cell has a double junction structure including a first i-type semiconductor layer formed of hydrogenated amorphous silicon (a-Si:H) and a second i-type semiconductor layer formed of hydrogenated microcrystalline silicon (mc-Si:H). A type 2 solar cell has a triple junction structure including a first i-type semiconductor layer formed of hydrogenated amorphous silicon (a-Si:H), a second i-type semiconductor layer formed of hydrogenated amorphous silicon (a-Si:H), and a third i-type semiconductor layer formed of hydrogenated microcrystalline silicon (mc-Si:H). A type 3 solar cell has a triple junction structure including a first i-type semiconductor layer formed of hydrogenated amorphous silicon (a-Si:H(C, O)) doped with at least one of carbon (C) and oxygen (O) as impurities, a second i-type semiconductor layer formed of hydrogenated amorphous silicon (a-Si:H), and a third i-type semiconductor layer formed of hydrogenated microcrystalline silicon (mc-Si:H). A type 4 solar cell has a triple junction structure including a first i-type semiconductor layer formed of hydrogenated amorphous silicon (a-Si:H), a second i-type semiconductor layer formed of Ge-doped hydrogenated amorphous silicon (a-Si:H(Ge)), and a third i-type semiconductor layer formed of hydrogenated microcrystalline silicon (mc-Si:H). A type 5 solar cell has a triple junction structure including a first i-type semiconductor layer formed of hydrogenated amorphous silicon (a-Si:H(C, O)) doped with at least one of carbon (C) and oxygen (O) as impurities, a second i-type semiconductor layer formed of Ge-doped hydrogenated amorphous silicon (a-Si:H(Ge)), and a third i-type semiconductor layer formed of hydrogenated microcrystalline silicon (mc-Si:H). A type 6 solar cell, as in the embodiment of the invention, has a triple junction structure including a first i-type semiconductor layer formed of hydrogenated amorphous silicon (a-Si:H(C, O)) doped with at least one of carbon (C) and oxygen (O) as impurities, a second i-type semiconductor layer formed of Ge-doped hydrogenated amorphous silicon (a-Si:H(Ge)), and a third i-type semiconductor layer formed of Ge-doped hydrogenated microcrystalline silicon (mc-Si:H(Ge)).

In FIG. 8, characteristics Voc, Jsc, FF, and Eff of the type 1 solar cell are set, so that the type 1 solar cell and the types 2 to 6 solar cells are compared with one another. The efficiency Eff of the type 1 solar cell having the double junction structure is 1, and the efficiency Eff of the types 2 to 5 solar cells each having the triple junction structure is approximately 0.65 to 1.18.

Further, the efficiency Eff of the type 6 solar cell is approximately 1.24 and is much greater than the efficiency Eff of the types 1 to 5 solar cells. More specifically, in the type 6 solar cell, a band gap of the first i-type semiconductor layer is approximately 1.9 eV, and thus an absorptance of the first i-type semiconductor layer with respect to light of a short wavelength band may increase. Further, a band gap of the second i-type semiconductor layer is approximately 1.5 eV, and thus an absorptance of the second i-type semiconductor layer with respect to light of a middle wavelength band may increase. Further, a band gap of the third i-type semiconductor layer is approximately 0.8 eV, and thus an absorptance of the third i-type semiconductor layer with respect to light of a long wavelength band may increase. As a result, the efficiency of the type 6 solar cell may be improved.

Figure 9:
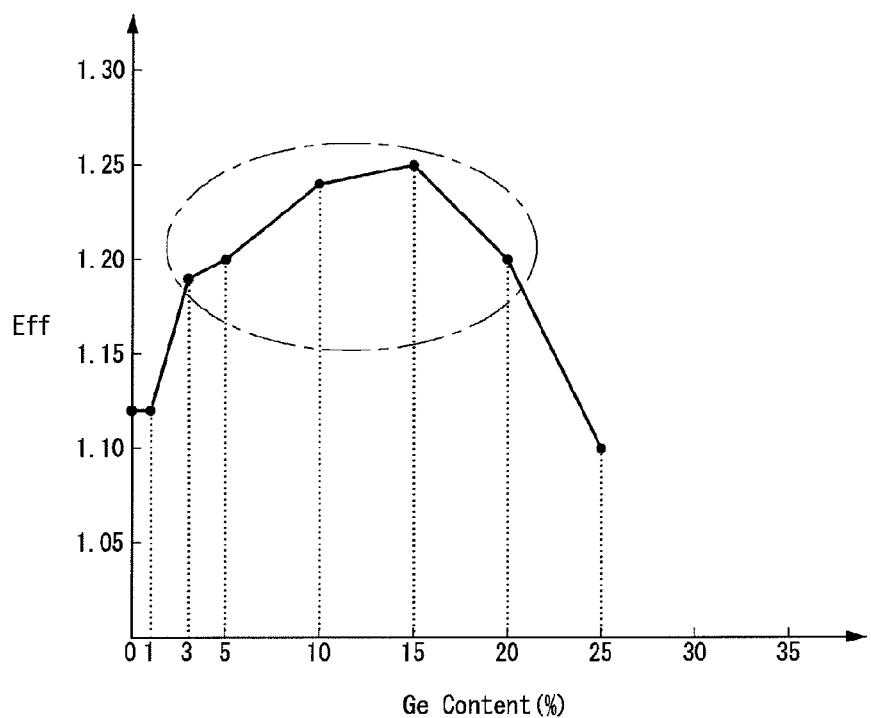

FIG. 9 is a graph illustrating the efficiency of a solar cell depending on a Ge content of a third i-type semiconductor layer. More specifically, FIG. 9 is a graph illustrating the efficiency of a solar cell depending on a Ge content of a third i-type semiconductor layer when a Ge content of a second i-type semiconductor layer is about 20 atom % and a carbon content of a first i-type semiconductor layer is about 20 atom %.

As shown in FIG. 9, when the Ge content of the third i-type semiconductor layer is 0 to 1 atom %, the efficiency of the solar cell is approximately 1.12. In this case, a band gap of the third i-type semiconductor layer may not be sufficiently reduced because of a small amount of Ge.

On the other hand, when the Ge content of the third i-type semiconductor layer is 3 to 20 atom %, the efficiency of the solar cell has a sufficiently improved value of approximately 1.19 to 1.25. In this case, the band gap of the third i-type semiconductor layer may be sufficiently reduced because of the sufficient Ge content. Hence, an absorptance of the third i-type semiconductor layer with respect to light of a long wavelength band may increase.

On the other hand, when the Ge content of the third i-type semiconductor layer is 25 atom %, the efficiency of the solar cell has a reduced value of approximately 1.10. In this case, a portion of Ge may operate as a defect inside the third i-type semiconductor layer because of an excessively large amount of Ge. As a result, the efficiency of the solar cell may be reduced in spite of an increase in the Ge content.

Considering the description of FIG. 9, it may be preferable, but not required, that the Ge content of the third i-type semiconductor layer is about 3 to 20 atom %.

Figure 10:
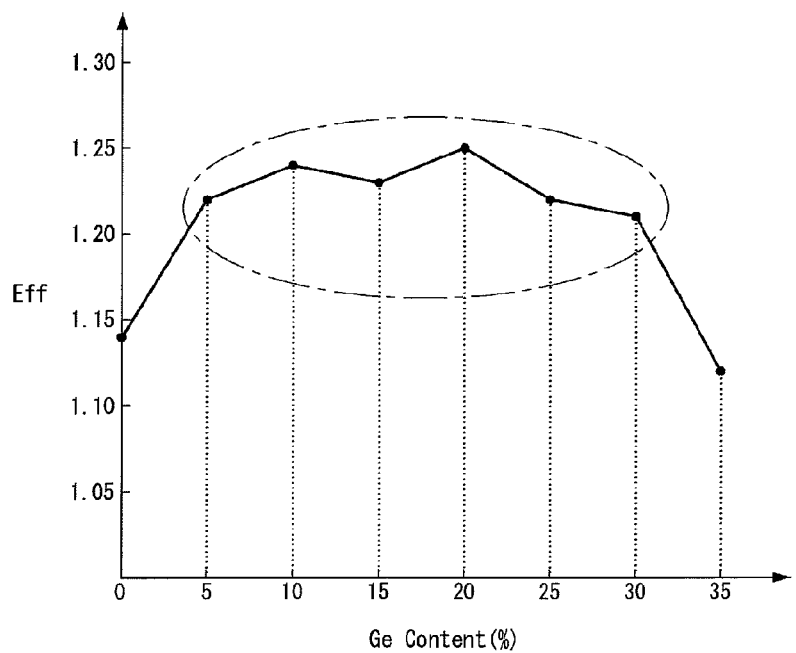

FIG. 10 is a graph illustrating the efficiency of a solar cell depending on a Ge content of a second i-type semiconductor layer. More specifically, FIG. 10 is a graph illustrating the efficiency of a solar cell depending on a Ge content of a second i-type semiconductor layer when a Ge content of a third i-type semiconductor layer is about 15 atom % and a carbon content of a first i-type semiconductor layer is about 20 atom %.

As shown in FIG. 10, when the second i-type semiconductor layer is not doped with Ge, the efficiency of the solar cell is approximately 1.14.

On the other hand, when the Ge content of the second i-type semiconductor layer is 5 to 30 atom %, the efficiency of the solar cell has a sufficiently improved value of approximately 1.21 to 1.25. In this case, an absorptance of the second i-type semiconductor layer with respect to light of a middle wavelength band may increase.

On the other hand, when the Ge content of the second i-type semiconductor layer is 35 atom %, the efficiency of the solar cell has a reduced value of approximately 1.12. In this case, a portion of Ge may operate as a defect inside the second i-type semiconductor layer because of an excessively large amount of Ge. As a result, the efficiency of the solar cell may be reduced in spite of an increase in the Ge content.

Considering the description of FIG. 10, it may be preferable, but not required, that the Ge content of the second i-type semiconductor layer is about 5 to 30 atom %.

As above, in the second and third i-type semiconductor layers doped with Ge as impurities, the Ge content of the third i-type semiconductor layer formed of Ge-doped microcrystalline silicon is less than the Ge content of the second i-type semiconductor layer formed of Ge-doped amorphous silicon. This is because a doping degree of microcrystalline silicon is less than a doping degree of amorphous silicon and a defect generation possibility of Ge of microcrystalline silicon is greater than a defect generation possibility of Ge of amorphous silicon.

In the embodiments, the Ge content indicates a content per unit volume and thus may be expressed by a concentration.

Figure 11:
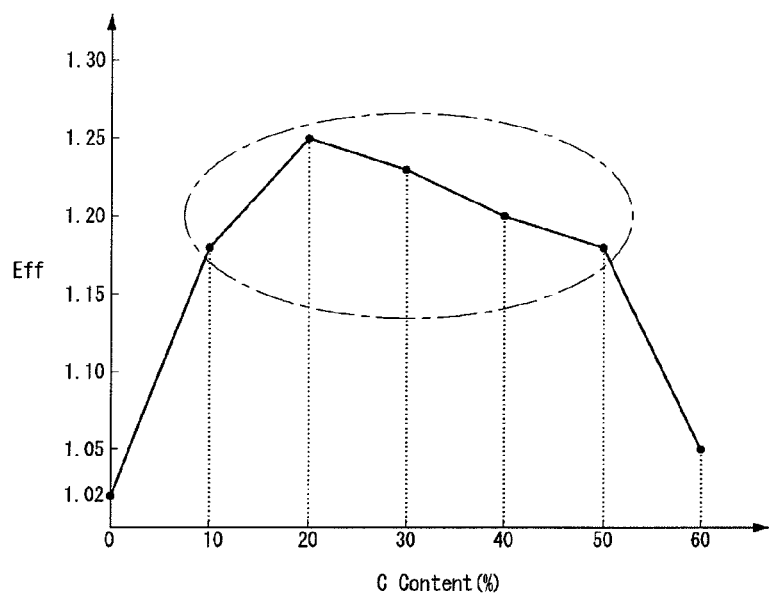

FIG. 11 is a graph illustrating the efficiency of a solar cell depending on a content of impurities contained in a first i-type semiconductor layer. More specifically, FIG. 11 is a graph illustrating the efficiency of a solar cell depending on a content of impurities contained in a first i-type semiconductor layer when a Ge content of a third i-type semiconductor layer is about 15 atom % and a Ge content of a second i-type semiconductor layer is about 20 atom %. Carbon (C) and oxygen (O) may be used as impurities with which the first i-type semiconductor layer is doped. FIG. 11 illustrates an example where carbon (C) is used as impurities. A result obtained when oxygen (O) is used as impurities may be similar to a result obtained when carbon (C) is used as impurities.

As shown in FIG. 11, when the first i-type semiconductor layer is not doped with carbon, the efficiency of the solar cell is approximately 1.02.

On the other hand, when the carbon content of the first i-type semiconductor layer is 10 to 50 atom %, the efficiency of the solar cell has a sufficiently improved value of approximately 1.18 to 1.25. In this case, an absorptance of the first i-type semiconductor layer with respect to light of a short wavelength band may increase.

On the other hand, when the carbon content of the first i-type semiconductor layer is 60 atom %, the efficiency of the solar cell has a reduced value of approximately 1.05. In this case, a portion of carbon may operate as a defect inside the first i-type semiconductor layer because of the excessive carbon content. As a result, the efficiency of the solar cell may be reduced in spite of an increase in the carbon content.

Considering the description of FIG. 11, it may be preferable that carbon content of the first i-type semiconductor layer is about 10 to 50 atom %.

FIGS. 12 to 18 are related to another structure of a solar cell according to an embodiment of the invention. A further description of structures and components identical or equivalent to those described above may be briefly made or may be entirely omitted.

Figure 12:
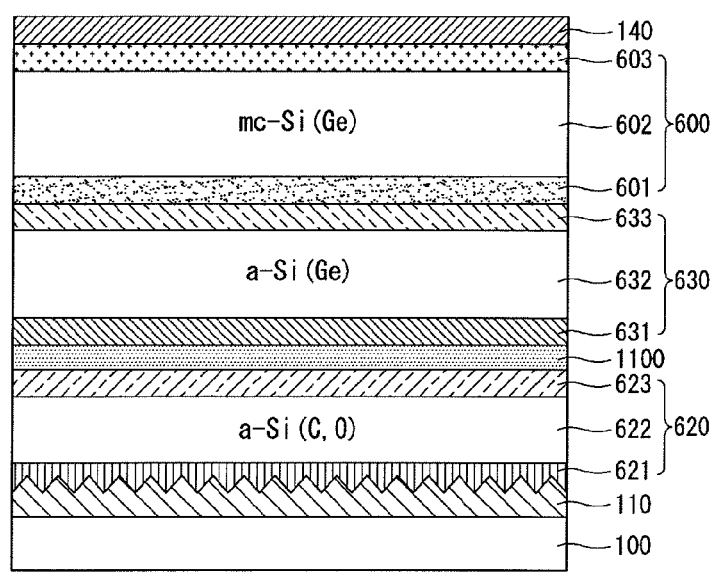

As shown in FIG. 12, an interlayer 1100 may be positioned between a first photoelectric transformation unit 620 and a second photoelectric transformation unit 630. The interlayer 1100 may reduce a thickness of a first i-type semiconductor layer 622 to thereby improve stability efficiency of a solar cell 10.

After an i-type semiconductor layer is manufactured, the efficiency of the i-type semiconductor layer may be reduced during a predetermined incident period of light. For example, during the predetermined incident period of light, the efficiency of the i-type semiconductor layer may be reduced to about 80% to 85% of an initial efficiency measured immediately after the i-type semiconductor layer is manufactured.

Afterwards, a reduced amount of the efficiency of the i-type semiconductor layer is saturated, and the efficiency of the i-type semiconductor layer reaches a uniform efficiency. The uniform efficiency is referred to as a stability efficiency.

The characteristic in which the efficiency of the i-type semiconductor layer falls from the initial efficiency to the stability efficiency may deepen as a thickness of the i-type semiconductor layer increases. In other words, as the thickness of the i-type semiconductor layer decreases, the stability efficiency may increase. However, if the thickness of the i-type semiconductor layer excessively decreases, a light absorptance of the i-type semiconductor layer may be reduced. Hence, the efficiency of the solar cell 10 may be reduced.

On the other hand, as shown in FIG. 12, if the interlayer 1100 is positioned between the first and second photoelectric transformation units 620 and 630, the interlayer 1100 reflects light transmitted by the first photoelectric transformation unit 620, and thus the light is absorbed in the first photoelectric transformation unit 620. Hence, even if the thickness of the first i-type semiconductor layer 622 of the first photoelectric transformation unit 620 decreases, a reduction in the efficiency of the solar cell 10 may be prevented or reduced. Further, the stability efficiency may be improved.

The interlayer 1100 may be formed using material with a low light absorptance capable of efficiently reflecting the light transmitted by the first photoelectric transformation unit 620. Preferably, though not required, the interlayer 1100 may be formed using ZnO, SiOx, etc., in consideration of a light absorptance and manufacturing cost.

Figure 13:
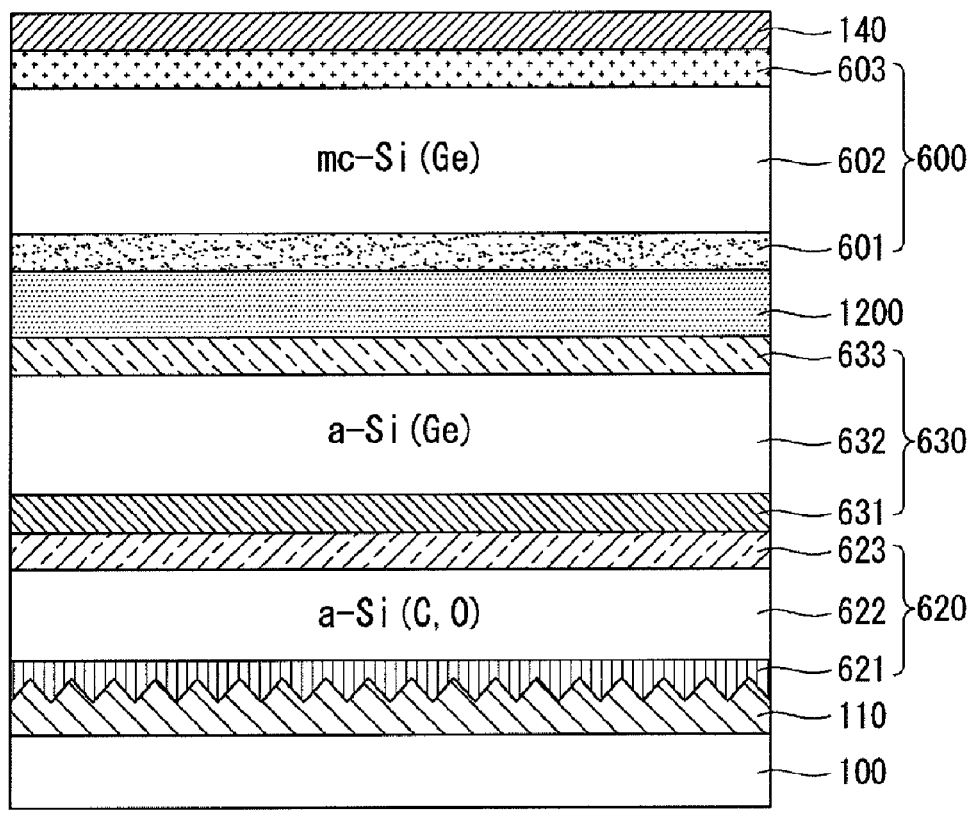
FIGS. 13 to 18 are related to another structure of a solar cell according to an embodiment of the invention.

Further, as shown in FIG. 13, an interlayer 1200 may be positioned between the second photoelectric transformation unit 630 and the third photoelectric transformation unit 600.

Figure 14:
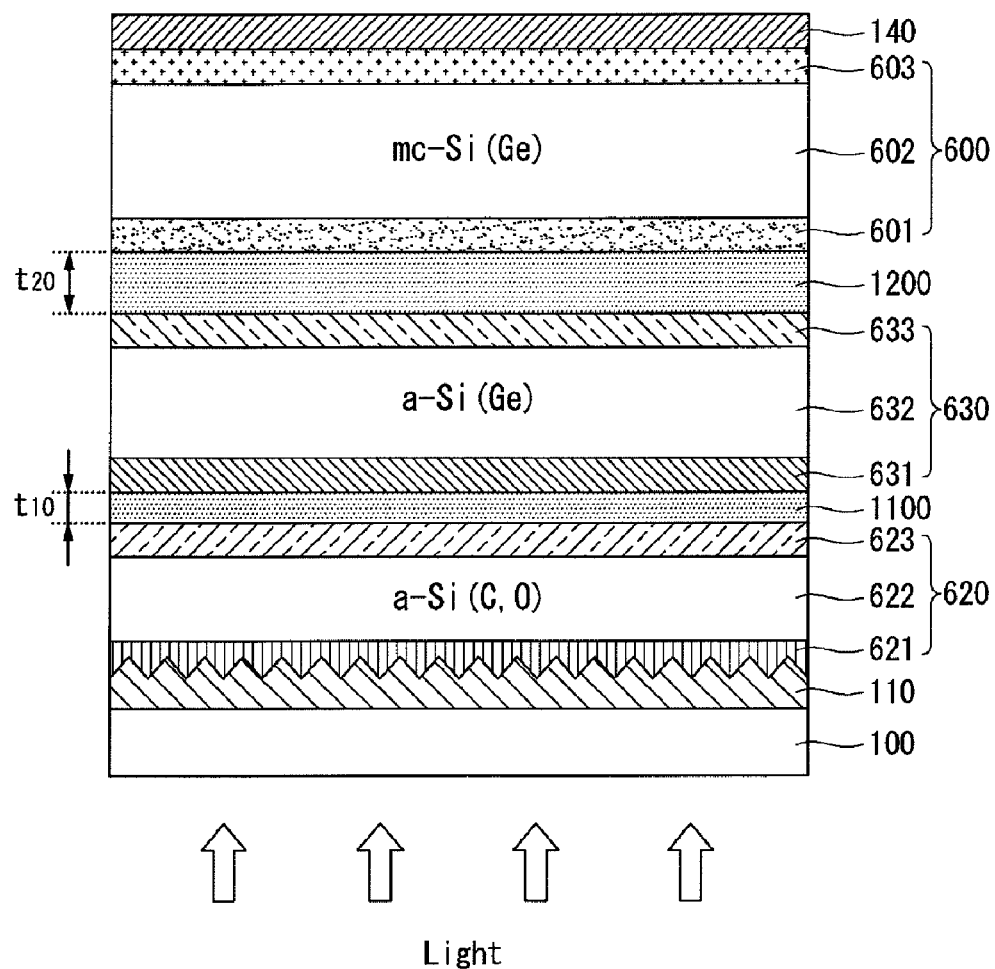

Further, as shown in FIG. 14, a first interlayer 1100 may be positioned between the first and second photoelectric transformation units 620 and 630, and a second interlayer 1200 may be positioned between the second and third photoelectric transformation units 630 and 600.

In this case, it may be preferable, but not required, that an absorptance of the first i-type semiconductor layer 622 with respect to light of a short wavelength band increases so as to further increase the efficiency of the solar cell 10. Therefore, it may be preferable, but not required, that the first interlayer 1100 efficiently reflects the light of the short wavelength band. For this, it may be preferable, but not required, that a refractive index of the first interlayer 1100 with respect to light of the short wavelength band is relatively large.

Further, it may be preferable, but not required, that an absorptance of a second i-type semiconductor layer 632 with respect to light of a middle or long wavelength band increases so as to further increase the efficiency of the solar cell 10. For this, it may be preferable, but not required, that a refractive index of the second interlayer 1200 with respect to light of the middle or a long wavelength band is relatively large.

In embodiments of the invention, it is assumed that there are a first wavelength band, and a second wavelength band that is longer than the first wavelength band.

A refractive index of the first interlayer 1100 is greater than a refractive index of the second interlayer 1200 at the first wavelength band, and the refractive index of the first interlayer 1100 is less than the refractive index of the second interlayer 1200 at the second wavelength band.

It may be preferable, but not required, that the refractive index of the second interlayer 1200 is equal to or greater than the refractive index of the first interlayer 1100 and also a thickness t20 of the second interlayer 1200 is greater than a thickness t10 of the first interlayer 1100.

Figure 15:
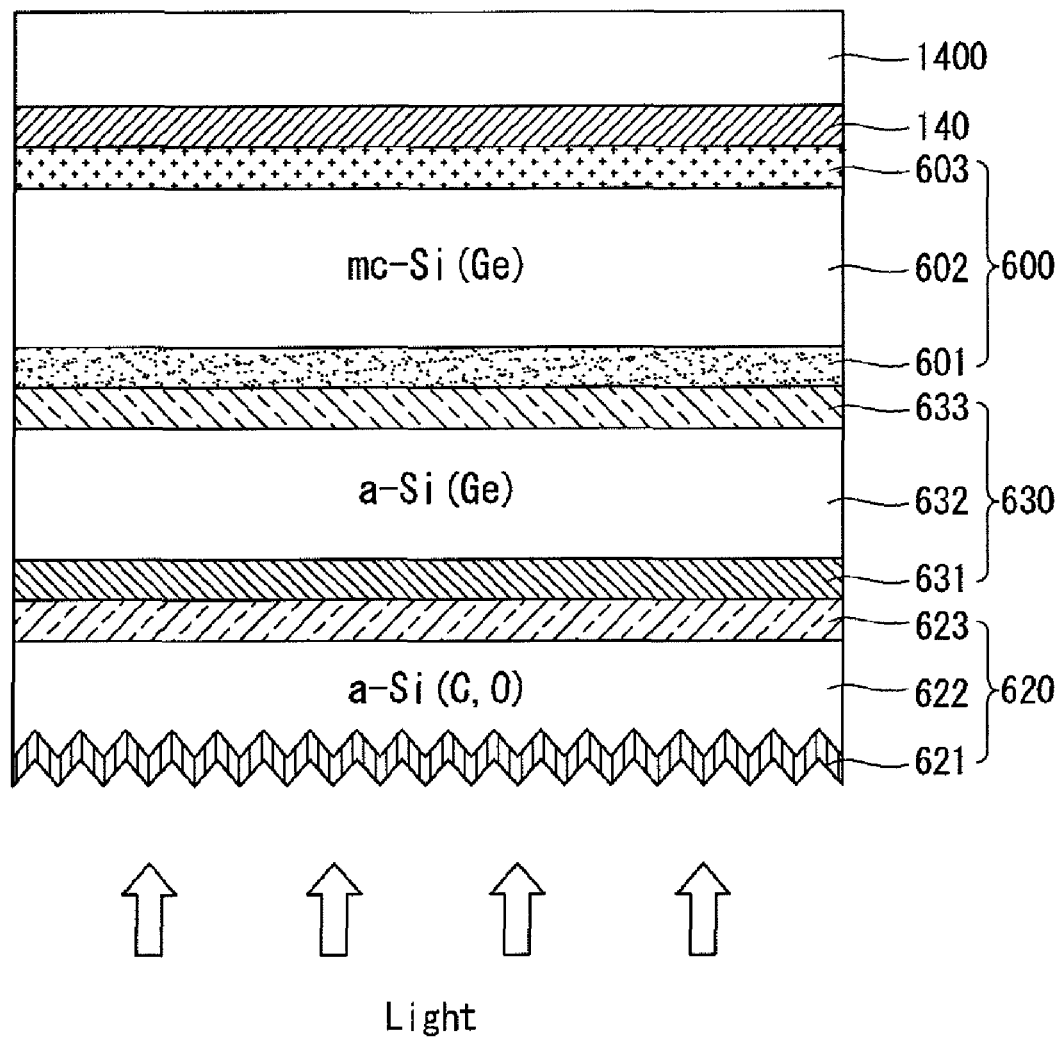

Further, as shown in FIG. 15, a substrate 1400 may be positioned opposite a light incident surface of the solar cell. More specifically, a third n-type semiconductor layer 603, a third i-type semiconductor layer 602, a third p-type semiconductor layer 601, a second n-type semiconductor layer 633, a second i-type semiconductor layer 632, a second p-type semiconductor layer 631, a first n-type semiconductor layer 623, a first i-type semiconductor layer 622, and a first p-type semiconductor layer 621 may be positioned on the substrate 1400 in the order named.

In such a structure shown in FIG. 15, because light is incident on the opposite side of the solar cell 10 from the substrate 1400, i.e., on the first p-type semiconductor layer 621, the substrate 1400 does not need to be transparent. Thus, the substrate 1400 may be formed of metal in addition to glass and plastic. The solar cell 10 having the structure shown in FIG. 15 may be referred to as an nip-type solar cell.

Further, although it is not shown in FIG. 15, the solar cell according to the embodiment of the invention may further include a reflective layer capable of reflecting transmitted light.

Figure 16:
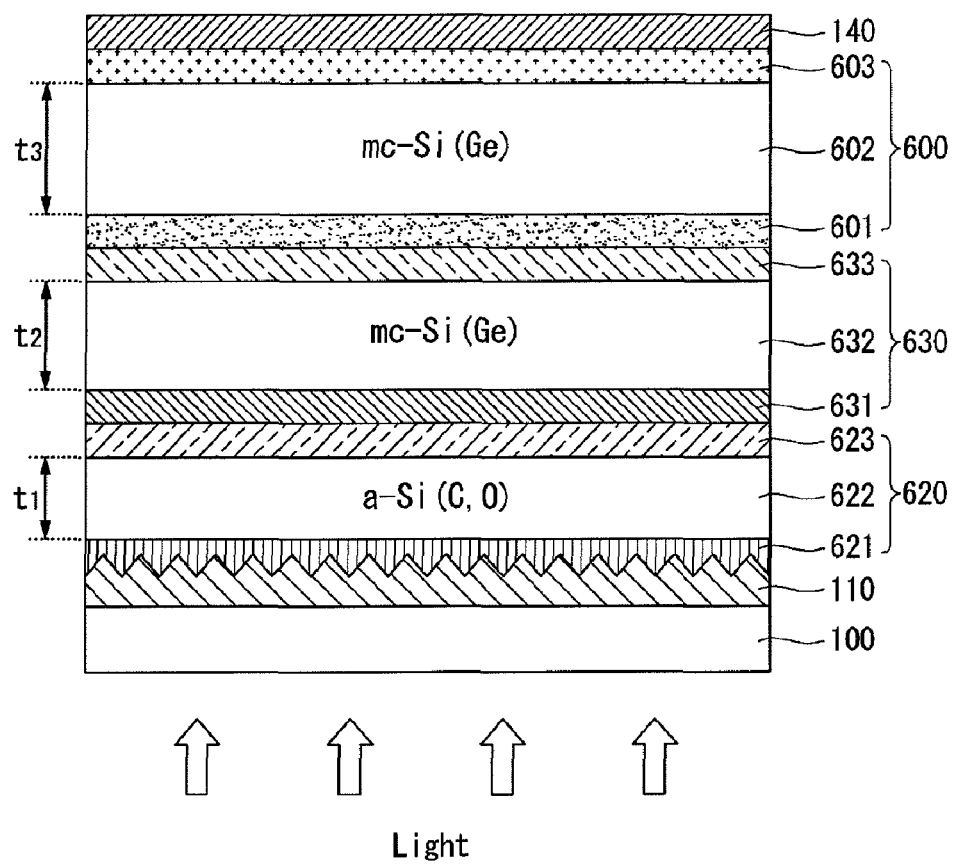

Further, as shown in FIG. 16, the solar cell 10 according to the embodiment of the invention may include a first photoelectric transformation unit 620 including a first i-type semiconductor layer 622 formed of amorphous silicon (a-Si(C, O)) doped with at least one of carbon (C) and oxygen (O) as impurities, a second photoelectric transformation unit 630 including a second i-type semiconductor layer 632 formed of Ge-doped microcrystalline silicon (mc-Si(Ge)), a third photoelectric transformation unit 600 including a third i-type semiconductor layer 602 formed of Ge-doped microcrystalline silicon (mc-Si(Ge)).

When comparing the solar cells illustrated in FIGS. 16 and 7, the solar cell illustrated in FIG. 16 includes the second i-type semiconductor layer 632 containing microcrystalline silicon instead of amorphous silicon contained in the second i-type semiconductor layer 632 of the solar cell illustrated in FIG. 7.

In this case, a thickness t2 of the second i-type semiconductor layer 632 formed of microcrystalline silicon may be smaller than a thickness t3 of the third i-type semiconductor layer 602 formed of microcrystalline silicon.

Figure 17:
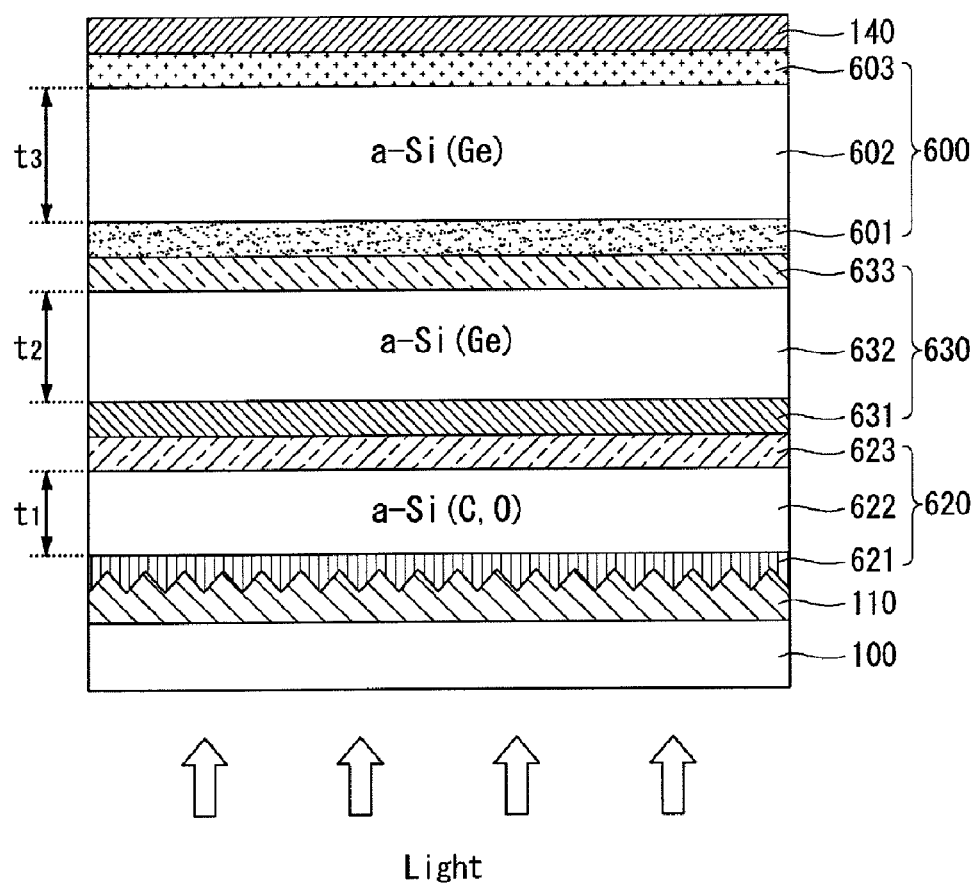

Further, as shown in FIG. 17, the solar cell 10 according to the embodiment of the invention may include a first photoelectric transformation unit 620 including a first i-type semiconductor layer 622 formed of amorphous silicon (a-Si(C, O)) doped with at least one of carbon (C) and oxygen (O) as impurities, a second photoelectric transformation unit 630 including a second i-type semiconductor layer 632 formed of Ge-doped amorphous silicon (a-Si(Ge)), a third photoelectric transformation unit 600 including a third i-type semiconductor layer 602 formed of Ge-doped amorphous silicon (a-Si (Ge)). In other words, all of the first, second, and third i-type semiconductor layers 622, 632, and 602 may contain amorphous silicon.

Figure 18:
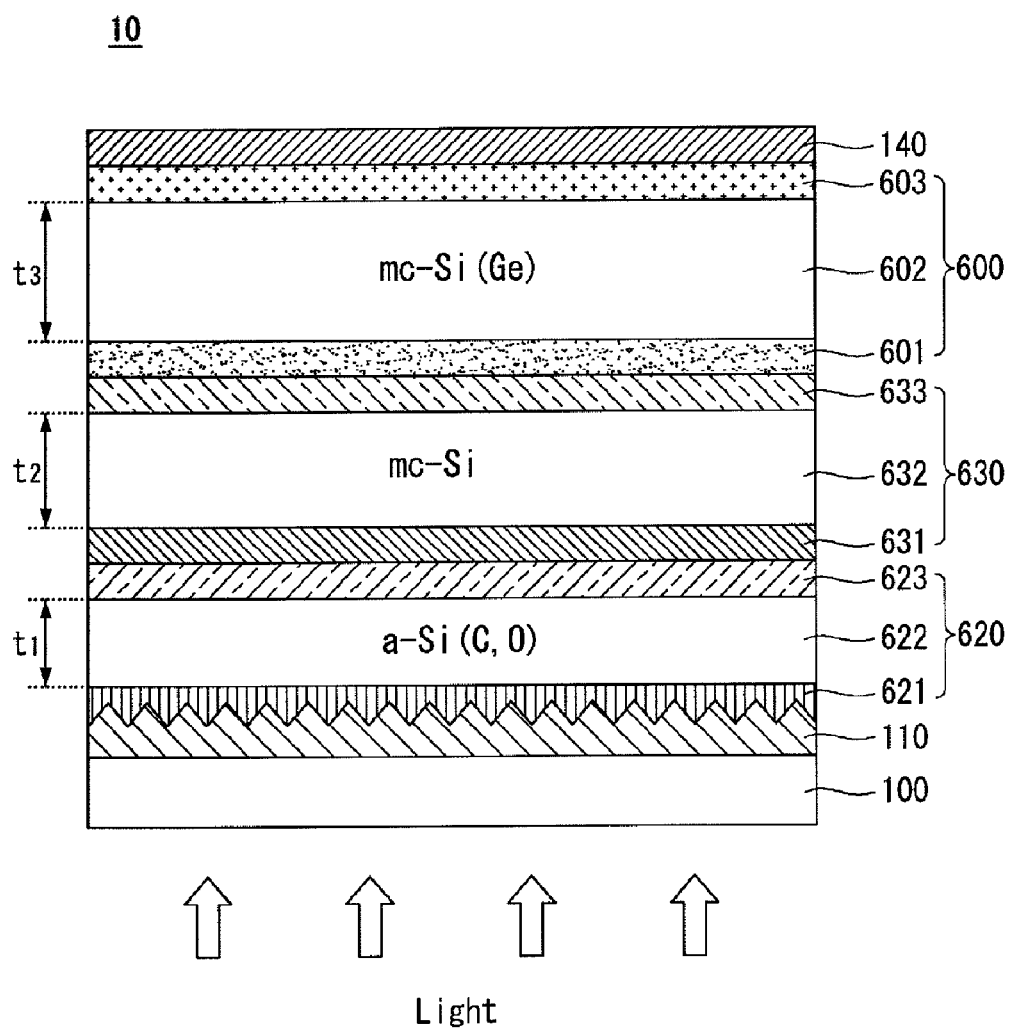

Further, as shown in FIG. 18, the solar cell 10 according to the embodiment of the invention may include a first photoelectric transformation unit 620 including a first i-type semiconductor layer 622 formed of amorphous silicon (a-Si(C, O)) doped with at least one of carbon (C) and oxygen (O) as impurities, a second photoelectric transformation unit 630 including a second i-type semiconductor layer 632 formed of microcrystalline silicon (mc-Si), a third photoelectric transformation unit 600 including a third i-type semiconductor layer 602 formed of Ge-doped microcrystalline silicon (mc-Si(Ge)). In other words, the third i-type semiconductor layer 602 formed of microcrystalline silicon may be doped with Ge, and the second i-type semiconductor layer 632 formed of microcrystalline silicon need not be doped with Ge.

In embodiments of the invention, a solar cell may have a plurality of i-type semiconductor layers, with each i-type semiconductor layer including the same or different forms of silicon (i.e., amorphous or microcrystalline). Further, each i-type semiconductor layer may be doped with the same or different type of impurity (i.e., at least one of C or O, and Ge). Preferably, but not required, the solar cell may have a plurality of i-type semiconductor layers, with each i-type semiconductor layer including a different form of silicon and each i-type semiconductor layer being doped with a different type of impurity.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A solar cell comprising:
   a substrate;
   a first electrode on a surface of the substrate;
   a second electrode; and
   a plurality of photoelectric transformation units between the first electrode and the second electrode, the plurality of photoelectric transformation units including:
   a first photoelectric transformation unit including a first intrinsic (an i-type) semiconductor layer formed of amorphous silicon doped with at least one of carbon (C) and oxygen (O) as impurities;
   a second photoelectric transformation unit including a second i-type semiconductor layer formed of germanium (Ge)-doped amorphous silicon;
   a third photoelectric transformation unit including a third i-type semiconductor layer formed of Ge-doped microcrystalline silicon;
   a first interlayer between the first photoelectric transformation unit and the second photoelectric transformation unit; and
   a second interlayer between the second photoelectric transformation unit and the third photoelectric transformation unit,
   wherein the first i-type semiconductor layer, the second i-type semiconductor layer and the third i-type semiconductor layer are positioned on the surface of the substrate in the order named, and
   a Ge content of the third i-type semiconductor layer is less than a Ge content of the second i-type semiconductor layer, wherein the Ge content of the third i-type semiconductor layer is about 3 atom % to 20 atom % and the Ge content of the second i-type semiconductor layer is about 5 atom % to 30 atom %, and
   a content of the at least one content of carbon (C) and oxygen (O) doped in the first i-type semiconductor layer is about 10 atom % to 50 atom %, and a thickness of the second interlayer is greater than a thickness of the first interlayer.

2. The solar cell of claim 1, wherein a thickness of the third i-type semiconductor layer is greater than a thickness of the second i-type semiconductor layer, and the thickness of the second i-type semiconductor layer is greater than a thickness of the first i-type semiconductor layer.

3. The solar cell of claim 1,
   wherein a refractive index of the first interlayer is greater than a refractive index of the second interlayer at a first wavelength band, and
   wherein the refractive index of the first interlayer is less than the refractive index of the second interlayer at a second wavelength band longer than the first wavelength band.

4. The solar cell of claim 1, wherein the first electrode includes an uneven pattern on an upper surface thereof, and the uneven pattern is in contact with the first photoelectric transformation unit.

* * * * *